United States Patent [19]

Griffith et al.

[11] Patent Number: 4,857,768
[45] Date of Patent: Aug. 15, 1989

[54] TRIPLE RAIL LOGIC GATE

[75] Inventors: Scott J. Griffith, Waltham; Steven E. Golson, Carlisle, both of Mass.

[73] Assignee: Sun Microsystems, Inc., Mountain View, Calif.

[21] Appl. No.: 186,626

[22] Filed: Apr. 27, 1988

[51] Int. Cl.$^4$ ............... H03K 17/16; H03K 19/20; H03K 5/22

[52] U.S. Cl. .................................. 307/443; 307/445; 307/451; 307/464; 307/355; 307/362; 307/530

[58] Field of Search ............... 307/443, 445, 451, 464, 307/530, 355, 362

[56] References Cited

U.S. PATENT DOCUMENTS 4,427,903 1/1984 Sugimoto .................. 307/355

Primary Examiner—Stanley D. Miller
Assistant Examiner—M. R. Wambach
Attorney, Agent, or Firm—Blakely Sokoloff Taylor & Zafman

[57] ABSTRACT

A multi-input logic gate is disclosed having particular application for use as an AND or OR gate in a digital circuit. The OR gate of the present invention includes drive, sense and reference rails. A plurality of input lines are coupled to a gate of a plurality of N-channel transfers disposed between the drive and sense rails, one input line per transistor. The drive rail is coupled to ground through an N-channel transistor whose gate is controlled by the state of a detect line. The sense and reference rails are coupled to a voltage source ($V_{dd}$) through P-channel transistors whose gate is also coupled to the detect line. The P-channel transistor coupled to the sense rail is sized to pass more current than the corresponding transfer on the reference rail. A sense amplifier is coupled to the sense and reference rails, and outputs a predetermined signal as a function of the voltage difference of the rails. In operation, a precharge circuit first precharges the drive, sense and reference rails to a known voltage. Signals are then applied to the inputs and allowed to stabilize. A detect signal is generated which turns on the P-channel transistors coupled to the sense and reference rails, and the N-channel transistor coupled between the drive rail and ground. In the event all inputs are low, the sense rail voltage rises faster than that of the reference rail, this voltage difference is sensed by the sense amplifier which outputs a predetermined signal indicating no inputs are high. In the event that one or more inputs are high, the corresponding N-channel transfer coupled between the drive rail and the sense rail is turned on, thereby pulling the sense rail toward ground. The sense amplifier senses that the reference rail voltage exceeds that of the sense rail outputs a signal indicating that at least one input is high. The present invention further includes an improved AND gate which permits an efficient determination of whether all of a multiplicity of inputs are true.

24 Claims, 3 Drawing Sheets

TRIPLE RAIL LOGIC GATE

BACKGROUND OF THE INVENTION

1. Field of the Invention

The present invention relates to digital logic gates, and more particularly, to improved AND and OR gates having a plurality of inputs, which may be used in a variety of circuit applications.

2. Art Background

In many computer systems, it is necessary to utilize AND or OR gates as part of a digital circuit. Typically, the use of an AND or OR gate within a circuit does not adversely impact the speed of the circuit, since the number of inputs into the particular logic gate is small. However, in the case where a logic gate must detect whether one of tens or hundreds of inputs are either high or low, the digital logic comprising the gate may take hundreds of nanoseconds to make the determination. The use of an AND or OR gate having tens or hundreds of inputs may significantly impact the speed of the digital circuit, and create a bottleneck to efficient circuit operation due to the length of time which the gate takes to generate an output.

As will be described, the present invention provides improved AND and OR gates which may be used in a variety of circuits requiring large numbers of inputs into the logic gate. The present invention's triple rail structure permits the logical AND or OR functions to be completed very quickly using a single logic gate, and significantly improves system performance time.

SUMMARY OF THE INVENTION

A multi-input logic gate is disclosed having particular application for use as an AND or OR gate in a digital circuit. The OR gate of the present invention includes drive, sense and reference rails. A plurality of input lines are coupled to a gate of a plurality of N-channel transistors disposed between the drive and sense rails, one input line per transistor. The drive rail is coupled to ground through an N-channel transistor whose gate is controlled by the state of a detect line. The sense and reference rails are coupled to a voltage source ($V_{dd}$) through P-channel transistors whose gate is also coupled to the detect line. The P-channel transistor coupled to the sense rail is sized to pass more current than the corresponding transistor on the reference rail. A sense amplifier is coupled to the sense and reference rails, and outputs a predetermined signal as a function of the voltage difference of the rails.

In operation, a precharge circuit first precharges the drive, sense and reference rails to known voltage. Signals are then applied to the inputs and allowed to stabilize. A detect signal is generated which turns on the P-channel transistors coupled to the sense and reference rails, and the N-channel transistor coupled between the drive rail and ground. In the event all inputs are low, the sense rail voltage rises faster than that of the reference rail, this voltage difference is sensed by the sense amplifier which outputs a predetermined signal indicating no inputs are high. In the event that one or more inputs are high, the corresponding N-channel transistor coupled between the drive rail and the sense rail is turned on, thereby pulling the sense rail toward ground. The sense amplifier then senses that the reference rail voltage exceeds that of the sense rail and outputs a signal indicating that at least one input is high. The present invention further includes an improved AND gate which permits an efficient determination of whether all of a multiplicity of inputs are true.

DETAILED DESCRIPTION OF THE INVENTION

An improved multi-input logic gate is disclosed having particular application for use as a OR or AND gate in a digital circuit. In the following description, for purposes of explanation, specific transistors, circuit devices, circuit architectures and components are set forth in order to provide a more thorough understanding of the present invention. However, it will be apparent to one skilled in the art that the present invention may be practiced without these specific details. In other instances, well known circuits and devices are shown in schematic form in order not to obscure the present invention unnecessarily.

Figure 1:
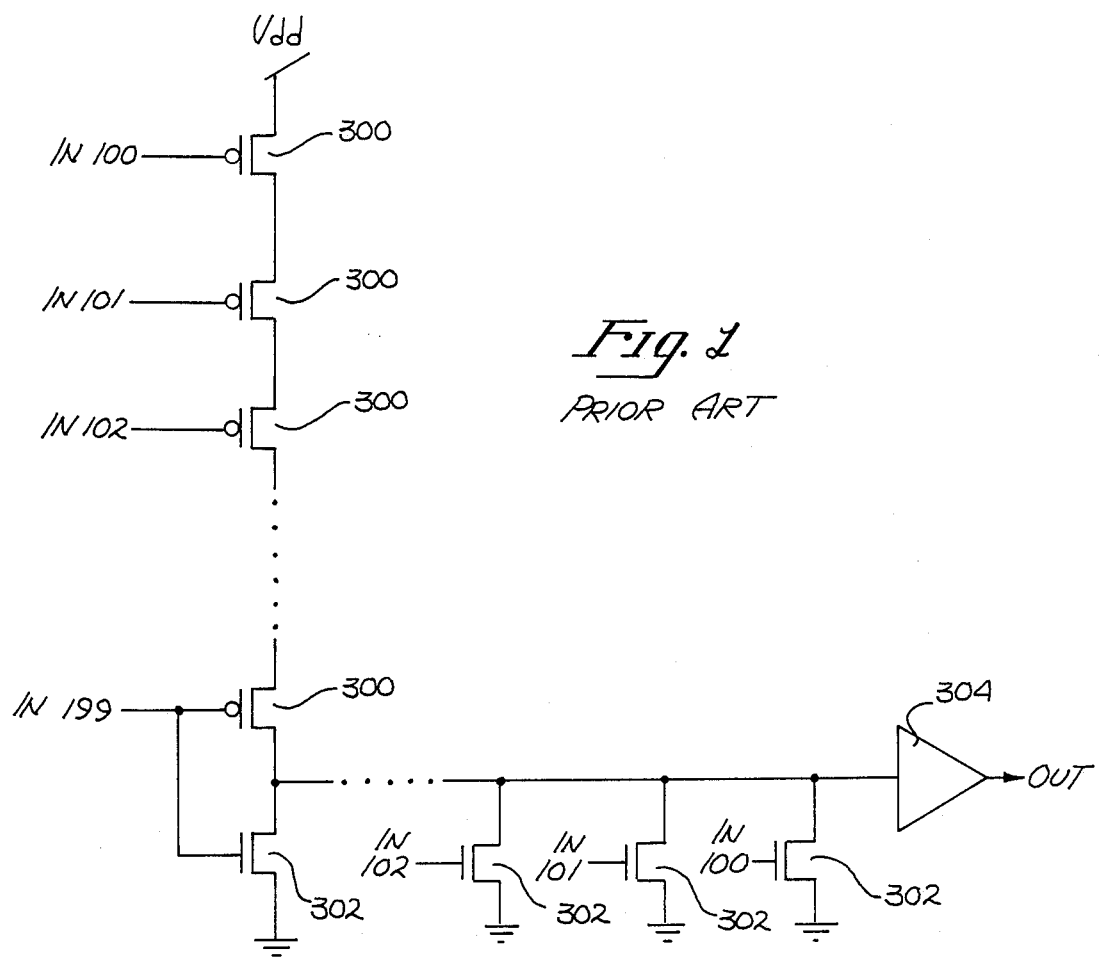
FIG. 1 is a schematic illustration of a prior art OR gate having 100 inputs.

With reference to FIG. 1, a prior art OR gate is disclosed which employs multiple inputs denoted as $I_n$ 100 through $I_n$ 199. For purposes of this Specification, the prior art OR circuit of FIG. 1 is described with reference to 100 inputs, however, the description of the operation of this prior art circuit may be generalized to an OR circuit having N inputs. As illustrated, each input (for example, input 100) is coupled to the gate of a P-channel transistor 300 as well as the gate of an N-channel transistor 302. The output of the prior art circuit of FIG. 1 is high if any one of the inputs is high, and will go low only if all of the inputs are low. In operation, the P-channel transistors 300 are turned off, such that no current passes through them, when the input to the gate is high. Conversely, the N-channel transistors 302 are turned off (no current passing therethrough) when the input to the N-channel transistor's gate is low. Accordingly, in the case where all inputs are low, P-channel transistors 300 are all turned on, and they permit current to pass therethrough from source $V_{dd}$ N-channel transistors 302 would then be off and the output of the circuit of FIG. 1 due to the presence of inverter 304 is low.

In the event that any one of the inputs ($I_n$ 100 through $I_n$ 199) are high, the P-channel transistor coupled to the high input line is turned off, and the corresponding N-channel transistor for the high input line is turned on. The enabling of an N-channel transistor results in the circuit of FIG. 1 pulled low to ground, and the output of inverter 304 high. It will be appreciated, however, that if all inputs are once again pulled low, a significant amount of time must elapse before enough current is provided through the P-channel transistors 300 from $V_{dd}$ to charge the input to the inverter 304 to a valid high state. It has been estimated that many hundreds of nanoseconds may elapse prior to the OR gate of FIG. 1 stabilizing through the 200 transistors (P and N-channel) illustrated in the Figure. Although the circuit may be brought to a low state very quickly because current need only flow through one transistor to get to ground, in order to achieve a high state where all inputs are low, the current must go through all 100 transistors illustrated in FIG. 1. It has been found that the use of an OR gate as illustrated in FIG. 1 significantly impacts the speed of modern digital circuits, and particularly, digital circuits incorporated within high speed data processing equipment. As will be described, the present invention provides improved OR and AND gates which have particular application in high speed digital circuits employed in computer equipment, and overcome the limitations of prior art system illustrated in FIG. 1.

Figure 2:
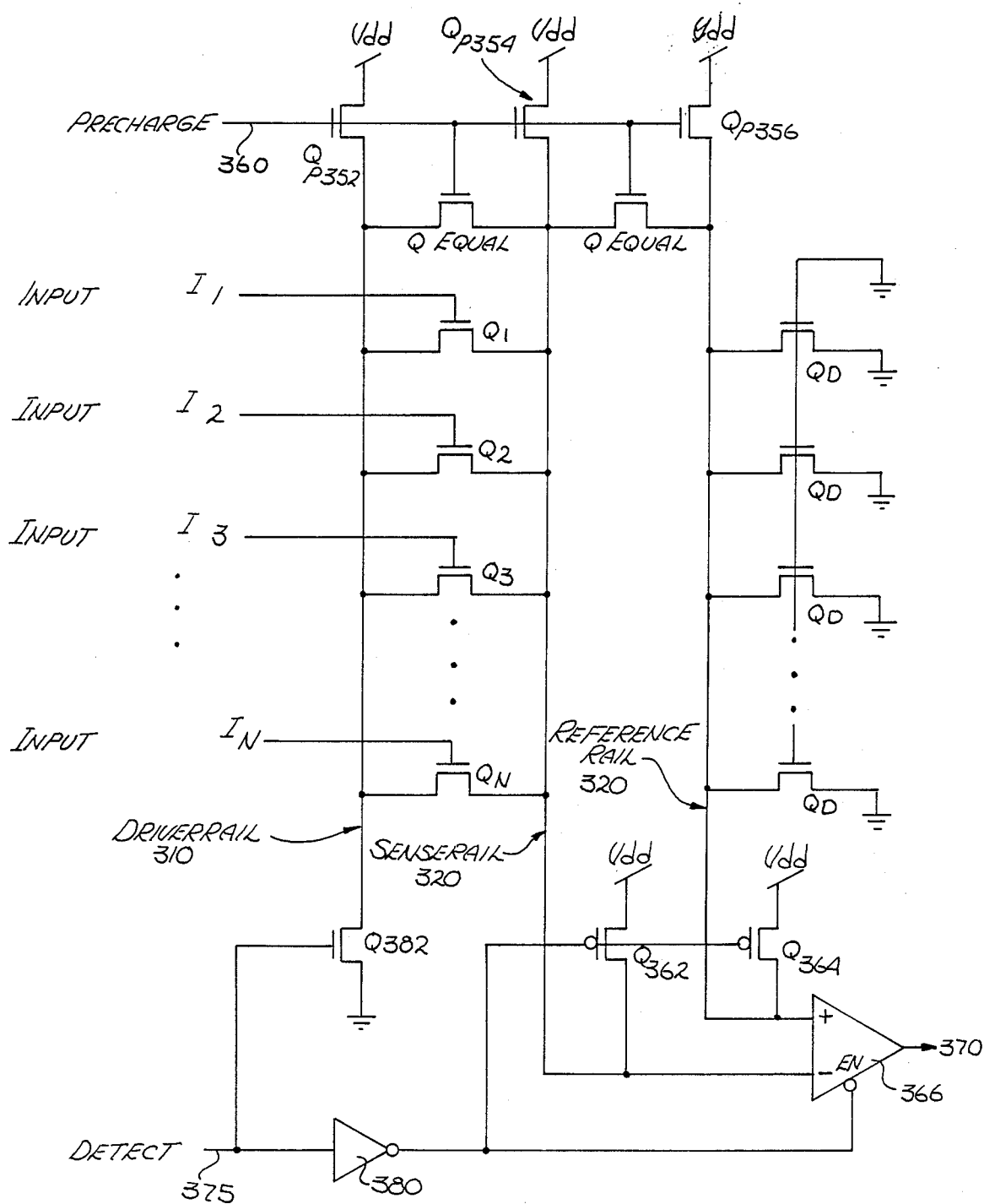
FIG. 2 is a schematic illustration of the present invention's triple rail OR gate.

Referring now to FIG. 2, the present invention's OR gate is illustrated in schematic circuit form. As shown, the OR gate includes a drive rail 310, a sense rail 315 and a reference rail 320. The drive rail 310 and sense rail 315 are coupled between the source and drain of N-channel transistors $Q_1$ through $Q_n$. Inputs $I_1$ through $I_n$ are coupled, as shown, to the gates of the N-channel transistors $Q_1$ through $Q_n$, respectively. A plurality of dummy transistors $Q_d$ are coupled between the reference rail 320 and ground in order to equalize the capacitances of the rails 310, 315 and 320. Drive rail 310 is coupled to the drain of transistor $Q_p$ 352, sense rail 315 is coupled to the drain of transistor $Q_p$ 354, and reference rail 320 is coupled to the drain of transistor $Q_p$ 356. The source of transistors $Q_p$ 352, $Q_p$ 354 and $Q_p$ 356 are coupled to voltage source $V_{dd}$. In addition, N-channel transistors $Q_{equal}$ are coupled between the drive rail 310, sense rail 315 and reference rail 320 as shown, and a precharge line 360 is coupled to the gates of $Q_p$ 352, $Q_p$ 354, $Q_p$ 356 and the $Q_{equal}$ transistors.

P-channel transistor $Q_{362}$ is coupled between voltage source $V_{dd}$ and sense rail 315, and P-channel transistor $Q_{364}$ is coupled, as shown between voltage source $V_{dd}$ and reference rail 320. As will be described more fully below, transistor $Q_{362}$ is sized such that it passes more current than transistor $Q_{364}$. A sense amplifier 366 is coupled to the reference rail 320 and sense rail 315. Sense amplifier 366 acts as a differential amplifier such that its output 370 goes to the state which is indicated by the difference between voltages on reference rail 320 and sense rail 315. A detect line 375 is coupled to an invertor 380 which is in turn coupled to the gates of P-channel transistors $Q_{362}$ and $Q_{364}$, and the enable port of sense amp 366. Detect line 375 is further coupled to the gate of N-channel transistor $Q_{382}$ the source of which is coupled to drive rail 310 and the drain of which is coupled to ground.

Figure 3:
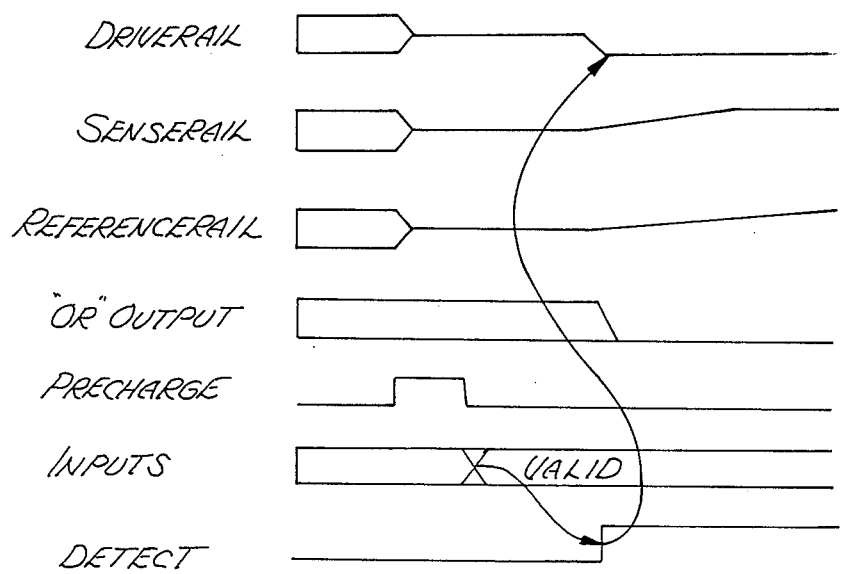
FIG. 3 is a timing diagram illustrating the state of various lines comprising the OR gate of FIG. 2 in the event that no input is high.
Figure 4:
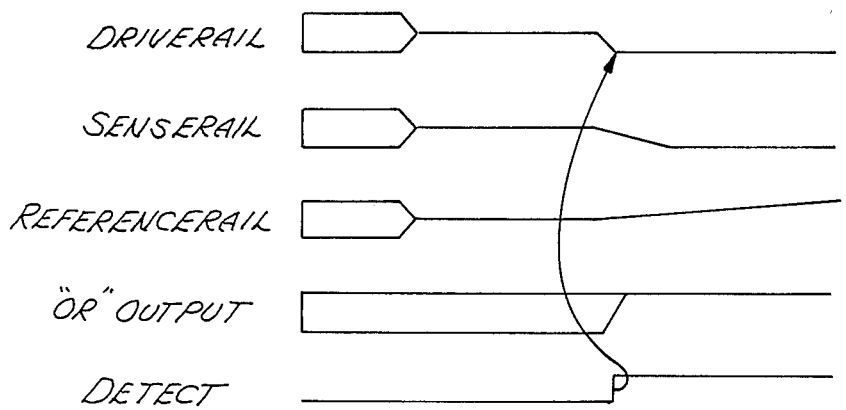
FIG. 4 is a timing diagram illustrating the state of various lines of the OR circuit of FIG. 2 in the event at least one input is high.

Referring now to FIGS. 2, 3, and 4, the operation of the OR circuit of the present invention will be described. Precharge line 360 is driven high such that transistors $Q_p$ 352, $Q_p$ 354, $Q_p$ 356, and the two $Q_{equal}$ transistors are turned on, thereby permitting current to pass therethrough. Accordingly, drive rail 310, sense rail 315, and reference rail 320 are driven high and are equalized to the same voltage. Due to the structure of the circuit illustrated in FIG. 2, the voltage of drive rail 310, sense rail 315 and reference rail 320 will stabilize in accordance with the equation $V = V_{dd} - V_{th}$, where $V_{th}$ equals the threshold voltage of the particular MOS transistor devices used. Typically, the value of $V_{th}$ equals approximately 0.6 volts, and the voltage on the drive rail, sense rail and reference rail approximately equals $V_{dd}/2$. As illustrated in the timing diagrams of FIGS. 3 and 4, subsequent to the precharge period, the inputs $I_1$ through $I_n$ are applied and permitted to stabilize for a predetermined amount of time. A detect signal is provided on line 375 which turns transistor $Q_{382}$ to on, as well as transistors $Q_{362}$ and $Q_{364}$. It will be appreciated that by permitting current to pass through transistor $Q_{382}$, drive rail 310 is immediately pulled low to ground. In the event that all of inputs $I_1$ through $I_n$ are low, then transistors $Q_1$ through $Q_n$ remain off. As previously described, transistor $Q_{362}$ is sized such that it passes a greater amount of current than transistor $Q_{364}$. Upon the application of a detect signal on line 375, transistors $Q_{362}$ and $Q_{364}$ are turned on pulling the sense rail 315 and reference rail 320 toward the $V_{dd}$ voltage. As best shown in FIG. 3, the voltage on the sense rail increase slightly faster, due to the sizing of the transistor $Q_{362}$, then that of the reference rail. Sense amp 366 senses a higher voltage on the sense rail and outputs a low signal indicating that no inputs were high.

Assume for sake of an example that one of the inputs ($I_1$ through $I_n$) to the circuit of FIG. 2 is high. Subsequent to the precharge of drive rail 310, sense rail 315 and reference rail 320, as described above, the application of the input signals to transistors $Q_1$ through $Q_n$ would result in one of the inputs (for example, input $I_3$) to be high. Accordingly, N-channel transistor $Q_3$ would be turned on. The application of a detect signal on line 375 turning on transistors $Q_{382}$, $Q_{362}$ and $Q_{364}$, results in drive rail 310 being pulled low to ground along with sense rail 315 through transistor $Q_3$. As illustrated in FIG. 4, and as in the case previously described above, transistor $Q_{364}$ pulls the reference rail 320 toward a higher voltage $V_{dd}$ such that the sense amp 366 senses that the reference rail voltage is higher than the sense rail voltage and outputs a signal on line 370, indicating that at least one of the inputs ($I_1$ through $I_n$) is high, and the output for the OR gate is therefore high (or true). It will be appreciated that if more than one of the inputs is high, then the sense rail 315 is pulled toward ground at a faster rate than if only a single input is high. It has been found that the present invention provides a significant increase in speed for determining an OR function, and, as will be described below, an AND function as well.

Figure 5:
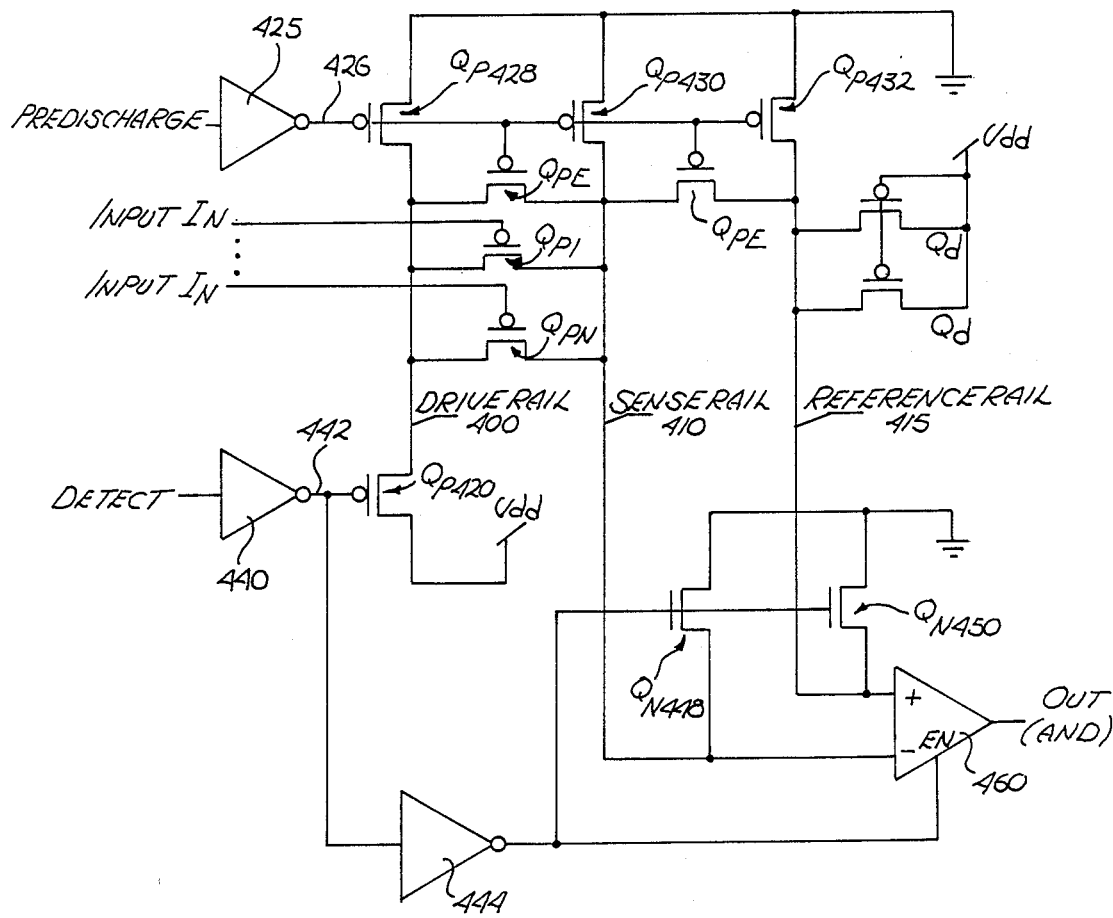
FIG. 5 is a schematic illustration of an AND gate utilizing the teachings of the present invention.

Referring now to FIG. 5, the present invention is illustrated as an AND logic gate, and includes a drive rail 400, a sense rail 410 and a reference rail 415. Inputs to the AND gate of FIG. 5 ($I_1$ through $I_n$) are coupled to the gates of P-channel transistors $Q_{p1}$ through $Q_{pn}$, which are in turn coupled between drive rail 400 and the sense rail 410. A plurality of dummy transistors $Q_d$ are coupled between the reference rail 415 and $V_{dd}$ in order to equalize the capacitances of the rails 400, 410 and 415. A P-channel transistor $Q_p$ 420 is coupled to the drive rail 400 and to $V_{dd}$ as illustrated in FIG. 5. A predischarge circuit is also provided, and includes an inventor 425 coupled to line 426. P-channel transistors $Q_p$ 428, $Q_p$ 430 and $Q_p$ 432 are coupled to the drive, sense and reference rails, respectively, and to ground. P-channel equalizing transistors $Q_{pe}$ are coupled between the drive rail 400, sense rail 410 and reference rail 415, as shown, with the gates of the transistors $Q_{pe}$, $Q_p$ 428, $Q_p$ 430 and $Q_p$ 432 coupled to line 426. A detect circuit includes an invertor 440 coupled to line 442. Line 442 is coupled to the gate of transistor $Q_p$ 420 and through invertor 444 to the gates N-channel transistors $Q_n$ 448 and $Q_n$ 450. As illustrated, the transistor $Q_n$ 448 is coupled between the sense rail 410 and ground, and transistor $Q_n$ 450 is coupled between the reference rail 415 and ground. Both the sense rail 410 and reference rail 415 are coupled to a sense amplifier 460 which is enabled by detect line 442.

In operation, driving the predischarge line high results in a low signal on line 426 after passing through the invertor 425. The low signal on line 426 acts to turn on transistors $Q_p$ 428, $Q_p$ 430, and $Q_p$ 432, as well as the equalizing transistors $Q_{pe}$. It will be appreciated, that since transistors are normally off when the gate state is high, that $Q_p$ 420, in the absence of a detect signal, is off. It will further be appreciated that since transistors $Q_{pe}$ are on, during the predischarge phase, that the drive rail 400, sense rail 410 and reference 415 are discharged to a threshold voltage above ground. At the end of the predischarge phase, line 426 turns off transistors $Q_p$ 428, $Q_p$ 430, $Q_p$ 432 and the equalizing transistors $Q_{pe}$. The input signals are then applied to inputs $I_1$ through $I_n$ and permitted it to stabilize.

The driving of the detect line high results in a low signal on line 442 after passing through invertor 440, which results in transistor $Q_p$ 420 being turned on, thereby allowing current to flow from voltage source $V_{dd}$ onto the drive rail 400. In addition, the application of a low signal on line 442 results in N-channel transistors $Q_n$ 448 and $Q_n$ 450 to be turned on, thereby pulling sense rail 410 and reference rail 415 low toward ground. In the present invention illustrated in FIG. 5, transistor $Q_n$ 448 is sized to pass more current than transistor $Q_n$ 450, such that the voltage on sense rail 410 will move toward a ground state faster than the voltage on reference rail 415. As is well known, an AND gate requires that the output 480 of sense amp 460 be high only when all the inputs to the AND gate are high, all other input states resulting in a low signal from the sense amp 460. It will be appreciated that in the event that any one of the inputs $I_1$ through $I_n$ are low, then an AND condition does not exist. The current passing through the drive rail 400 will be passed to the sense rail 410 bringing its voltage to a higher value than the reference rail, which when sensed by the sense amp 460 results in a low output on line 480 indicating that an AND condition does not exist.

Accordingly, an improved OR and AND gate has been disclosed which permits high speed logic functions to be completed. The present invention has particular application for use in high speed digital computer environments, and may be incorporated into a variety of digital circuitry. Although the present invention has been described with reference to FIGS. 1 through 5, it will be appreciated by one skilled in the art that the figures are for illustration only, and do not serve as limitations on the invention.

We claim:

1. An improved logic gate, comprising:
   a drive rail line;
   a sense rail line;
   a reference rail line;
   first transistor means coupled between said drive rail and said sense rail for selectively permitting current to pass between said drive and sense rails;
   a plurality of input lines, each of said input lines coupled to a gate of said first transistor means, respectively, such that if an input line is in a first state the transistor means to which said input line is coupled passes current;
   second transistor means coupled between a known voltage source ($V_{dd}$) and said sense rail;
   third transistor means coupled between said voltage source ($V_{dd}$) and said reference rail, said third transistor means being sized to pass less current than said second transistor means;
   fourth transistor means coupled between said drive rail and ground;
   detection signaling means for generating a detect signal and providing said signal to the gates of said second, third and fourth transistor means, the receipt of said signal resulting in the passage of current through said second, third and fourth transistor means;
   sensing means coupled to said sense and reference rails for sensing the voltage on said rails and generating a predetermined output if the voltage on one of said rails exceeds the voltage on the other.

2. The logic gate as defined by claim 1, further including precharge means coupled to said drive, sense and reference rails for selectively charging said rails to a known state prior to the generation of said detect signal.

3. The logic gate as defined by claim 2, wherein said first transistor means comprises transistors, at least one transistor for each of said input lines.

4. The logic gate as defined by claim 3, further including fifth transistor means coupled to said reference rail for equalizing the capacitance of said reference rail and said sense rail.

5. The logic gate as defined by claim 3, wherein said sensing means comprises a sense amplifier.

6. The logic gate as defined by claim 5, wherein said precharge means includes sixth transistor means coupled between said drive rail, sense rail and reference rail to equalize the voltage on said rails.

7. The logic gate as defined by claim 6, wherein said precharge means further includes:
   seventh transistor means coupled between said voltage source $V_{dd}$ and said drive rail, sense rail and reference rail, respectively;
   a precharge line coupled to said sixth and seventh transistor means, such that if a precharge signal is provided on said precharge line, said sixth and seventh transistor means turn on and pass current therethrough.

8. The logic gate as defined by claim 7, wherein said sixth and seventh transistor means comprises N-channel transistors.

9. The logic gate as defined by claim 6, wherein said first transistor means comprise N-channel transistors.

10. The logic gate as defined by claim 6, wherein said fourth transistor means comprises an N-channel transistor.

11. The logic gate as defined by claim 6, wherein said second and third transistor means comprises P-channel transistors.

12. The logic gate as defined by claim 6, further including an invertor coupled between said detection signalling means and the gates of said second and third transistor means.

13. The logic gate as defined by claim 2, wherein said known state is approximately $V_{dd} - V_{th}$, where $V_{th}$ equals the threshold voltages of said sixth and seventh transistor means.

14. An improved AND gate comprising:
   a drive rail line;
   a sense rail line;
   a reference rail line;

first transistor means coupled between said drive and sense rails for selectively permitting current to pass between said drive and sense rails;

a plurality of input lines, each of said input lines coupled to a gate of said first transistor means, respectively, such that if an input line is in a first state the transistor means to which said input line is coupled passes current;

second transistor means coupled between said drive rail line and a known voltage ($V_{dd}$);

third transistor means coupled between said sense rail and ground;

fourth transistor means coupled between said reference rail and ground, said fourth transistor means being sized to pass less current than said third transistor means;

detection signalling means for generating a detect signal and providing said signal to the gates of said second, third and fourth transistor means, the receipt of said signal resulting in the passage of current through said second, third and fourth transistor means;

sensing means coupled to said sense and reference rail lines for sensing the voltage on said rails and generating a predetermined output if the voltage on one of said rails exceed the voltage on the other.

15. The AND gate as defined by claim 14, further including predischarge means coupled to said drive, sense and reference rails for selectively discharging said rails to a threshold level above ground prior to the generation of said detect signal.

16. The AND gate as defined by claim 15, wherein said first transistor means comprises transistors, at least one transistor for each of said input lines.

17. The AND gate as defined by claim 16, wherein said sensing means comprises a sense amplifier.

18. The AND gate as defined by claim 17, wherein said predischarge means includes fifth transistor means coupled between said drive rail, sense rail and reference rail to equalize the voltage on said rails.

19. The AND gate as defined by claim 18, wherein said predischarge means further includes:

sixth transistor means coupled between said drive, sense and reference rails and ground;

a pre-discharge line coupled to said fifth and sixth transistor means, such that if a predischarge signal is provided on said predischarge line, said fifth and sixth transistor means turn on and bring said drive, sense and reference rails to a threshold state above ground.

20. The AND gate as defined by claim 19, wherein said first transistor means comprises P-channel transistors.

21. The AND gate as defined by claim 20, wherein said second transistor means comprises at least one P-channel transistor.

22. The AND gate as defined by claim 21, wherein said third and fourth transistor means comprise N-channel transistors.

23. The AND gate as defined by claim 22, further including seventh transistor means coupled to said reference rail for equalizing the capacitance of said reference rail and said sense rail.

24. The AND gate as defined by claim 23, wherein said fifth and sixth transistor means comprise P-channel transistors.

* * * * *

UNITED STATES PATENT AND TRADEMARK OFFICE
CERTIFICATE OF CORRECTION

PATENT NO. : 4,857,768

DATED : 8/15/89

INVENTOR(S) : Griffith et al.

It is certified that error in the above-identified patent and that said Letters Patent is hereby corrected as shown below:

col. 02, line 51     after "$V_{DD}$"     insert --.-- col. 04, line 57     delete "inventor"     insert --inverter--

Signed and Sealed this

Sixteenth Day of April, 1991

Attest:

HARRY F. MANBECK, JR.

*Attesting Officer*     *Commissioner of Patents and Trademarks*